United States Patent
Usuda

(10) Patent No.: US 10,283,934 B2
(45) Date of Patent: May 7, 2019

(54) SEMICONDUCTOR LASER OSCILLATOR

(71) Applicant: AMADA HOLDINGS CO., LTD., Kanagawa (JP)

(72) Inventor: Kaori Usuda, Kanagawa (JP)

(73) Assignee: AMADA HOLDINGS CO., LTD., Kanagawa (JP)

( * ) Notice: Subject to any disclaimer, the term of this patent is extended or adjusted under 35 U.S.C. 154(b) by 0 days.

(21) Appl. No.: 15/540,062

(22) PCT Filed: Mar. 1, 2016

(86) PCT No.: PCT/JP2016/056203
§ 371 (c)(1),
(2) Date: Jun. 27, 2017

(87) PCT Pub. No.: WO2016/152404
PCT Pub. Date: Sep. 29, 2016

(65) Prior Publication Data
US 2018/0026425 A1  Jan. 25, 2018

(30) Foreign Application Priority Data
Mar. 25, 2015 (JP) .................. 2015-062039

(51) Int. Cl.
*H01S 5/068* (2006.01)
*H01S 5/14* (2006.01)
(Continued)

(52) U.S. Cl.
CPC ........ *H01S 5/06804* (2013.01); *B23K 26/064* (2015.10); *B23K 26/0676* (2013.01);
(Continued)

(58) Field of Classification Search
CPC .. H01S 5/06804; H01S 5/4025; H01S 5/0612; H01S 5/4062; H01S 3/137;
(Continued)

(56) References Cited

U.S. PATENT DOCUMENTS 5,161,165 A  11/1992 Zorabedian
6,252,897 B1  6/2001 Abe
(Continued)

FOREIGN PATENT DOCUMENTS

EP  1359686  11/2003
JP  05-206587  8/1993
(Continued)

OTHER PUBLICATIONS

Search Report and Written Opinon issued in International Patent Application No. PCT/JP2016/056203, dated May 24, 2016.
(Continued)

*Primary Examiner* — Xinning (Tom) Niu
(74) *Attorney, Agent, or Firm* — Greenblum & Bernstein, P.L.C.

(57) ABSTRACT

A semiconductor laser oscillator includes laser diode modules. A temperature sensor directly or indirectly detects a temperature of at least one of the laser diode modules. A collimating lens collimates respective lasers emitted from the laser diode modules. A grating performs spectrum beam coupling for the lasers emitted from the collimating lens. An incident angle varying mechanism changes incident angles of the respective lasers, at which the lasers emitted from the collimating lens are incident onto the grating in response to the temperature detected by the temperature sensor.

10 Claims, 6 Drawing Sheets

(51) Int. Cl.
*H01S 5/06* (2006.01)
*H01S 5/40* (2006.01)
*H01S 3/137* (2006.01)
*B23K 26/064* (2014.01)
*B23K 26/067* (2006.01)

(52) U.S. Cl.
CPC ............ *H01S 3/137* (2013.01); *H01S 5/0607* (2013.01); *H01S 5/068* (2013.01); *H01S 5/0612* (2013.01); *H01S 5/14* (2013.01); *H01S 5/143* (2013.01); *H01S 5/4012* (2013.01); *H01S 5/4025* (2013.01); *H01S 5/4062* (2013.01); *H01S 5/4087* (2013.01)

(58) Field of Classification Search
CPC .... H01S 5/4087; H01S 5/0607; H01S 5/4012; H01S 5/143; H01S 5/14; H01S 5/068; B23K 26/0676; B23K 26/064
See application file for complete search history.

(56) References Cited

U.S. PATENT DOCUMENTS

| | | | |
|---|---|---|---|
| 6,636,536 B1* | 10/2003 | Tisue | H01S 5/141 372/20 |
| 7,199,924 B1* | 4/2007 | Brown | G02B 27/1006 359/556 |
| 7,656,911 B2 | 2/2010 | Mizutani et al. | |
| 9,588,045 B2* | 3/2017 | Kleppe | |
| 2003/0193974 A1* | 10/2003 | Frankel | H01S 5/4062 372/20 |
| 2003/0206336 A1 | 11/2003 | Onaka et al. | |
| 2005/0243293 A1* | 11/2005 | Hara | G03F 7/70341 355/53 |
| 2008/0025349 A1 | 1/2008 | Mizutani et al. | |
| 2012/0033697 A1 | 2/2012 | Goyal et al. | |
| 2013/0163624 A1 | 6/2013 | Miyanaga et al. | |
| 2015/0325980 A1 | 11/2015 | Fujita et al. | |

FOREIGN PATENT DOCUMENTS

| | | |
|---|---|---|
| JP | 08-097516 | 4/1996 |
| JP | 10-107377 | 4/1998 |
| JP | 11-186648 | 7/1999 |
| JP | 2003-324227 | 11/2003 |
| JP | 2004-128072 | 4/2004 |
| JP | 2005-159000 | 6/2005 |
| JP | 2011-40627 | 2/2011 |
| JP | 2012-174720 | 9/2012 |
| JP | 2014-127651 | 7/2014 |
| JP | 2014-157958 | 8/2014 |
| WO | 01/93383 | 12/2001 |
| WO | 2006/008873 | 1/2006 |
| WO | 2012/033105 | 3/2012 |

OTHER PUBLICATIONS

Official Communication issued in European Patent Office (EPO) Patent Application No. 16768307.7, dated Nov. 29, 2018.

* cited by examiner

SEMICONDUCTOR LASER OSCILLATOR

TECHNICAL FIELD

The present disclosure relates to a semiconductor laser oscillator that emits a laser.

BACKGROUND ART

Heretofore, a semiconductor laser oscillator has been widely used for exciting a solid-state laser or a fiber laser, and higher luminance of the semiconductor laser oscillator has been achieved, whereby a processing machine of a direct diode laser (DDL) for use in direct processing has been widespread. As a DDL oscillator, it is an oscillator that uses a plurality of laser diodes, each of which has a high-output single emitter. This DDL oscillator emits lasers winch are individually locked to a plurality of wavelengths, and are subjected to spectrum beam coupling.

CITATION LIST

Patent Literature

[PTL 1] Japanese Unexamined Patent Application Publication No. 2012-174720

SUMMARY OF THE INVENTION

In the DDL oscillator, high power and a high luminance are achieved by coupling spectrum beams with one another. In order to realize the spectrum beam coupling of the lasers with the plurality of the wavelength, it is necessary to narrow the spectra of the respective wavelengths. Accordingly, the DDL oscillator locks the lasers at a plurality of desired wavelengths by an external resonator.

At this time, as wavelength-locking efficiency is higher, the spectrum beam coupling can be performed more efficiently, and a highly efficient laser output is obtained. In order to increase the wavelength-locking efficiency, it is necessary to optimize the material of the laser diodes and locking wavelengths.

Each of the laser diodes has characteristics that the wavelength of the laser is shifted by temperature. At the time of cold start, the time of a low output or the time of short pulse oscillation, when the temperature of the laser diode is low, the wavelength-locking efficiency decreases, and the efficiency of the wavelength-combined laser diode also decreases.

A laser, in which wavelength-locking efficiency is low, and which is oscillated at a wavelength other than the locking wavelength, deviates from an optical axis, and increases the loss of the laser to be emitted. Then, the loss causes heat generation on the inside of the semiconductor laser oscillator and local heat generation of a transmission fiber incident portion. Hence, the performance of the semiconductor laser oscillator cannot be maximized.

It is an object of the embodiment to provide a semiconductor laser oscillator capable of maintaining the highly efficient wavelength-locking efficiency even in a state in which the temperature of the laser diode is low.

An aspect of the embodiment provides a semiconductor laser oscillator including: a plurality of laser diode modules; a temperature sensor configured to directly or indirectly detect a temperature of at least one laser diode module among the plurality laser diode modules; a collimating lens configured to collimate respective lasers emitted from the laser diode modules; a grating configured to perform spectrum beam coupling for the lasers emitted from the collimating lens; and an incident angle varying mechanism configured to change incident angles of the respective lasers, at which the lasers emitted from the collimating lens are incident onto the grating, in response to the temperature detected by the temperature sensor.

In the above-described configuration, a first configuration example of the incident angle varying mechanism is composed by including: a driver configured to move the collimating lens and the grating in a direction perpendicular to the optical axis of the collimating lens; and a movement controller configured to control movement of the collimating lens and the grating in response to the temperature detected by the temperature sensor.

In the above-described configuration, a second configuration example of the incident angle varying mechanism is composed by including: a first driver configured to rotate the grating in a direct ion of changing incident angles of the lasers; a total reflection mirror onto which the laser emitted from the grating is incident; a second driver configured to move the total reflection mirror so that a deviation of an optical axis of the laser emitted from the grating is corrected, the deviation being caused by an action in which the first driver rotates the grating; and a rotation/movement controller configured to control the rotation of the grating by the first driver and the movement of the total reflection mirror by the second driver in response to the temperature detected by the temperature sensor.

In the above-described configuration, a third configuration example of the incident angle varying mechanism is composed by including: a synthetic quartz substrate disposed in front of the collimating lens; a driver configured to rotate the synthetic quartz substrate to change incident angles of the lasers incident onto the grating; and a rotation controller configured to control rotation of the synthetic quartz substrate by the driver in response to the temperature detected by the temperature sensor.

In accordance with the semiconductor laser oscillator according to the embodiment, a highly efficient wavelength-locking efficiency can be maintained even in a state in which the temperature of the laser diode is low.

MODES FOR CARRYING OUT THE INVENTION

Hereinafter, a description will be made of a semiconductor laser oscillator according to the embodiment with reference to the accompanying drawings. First, a description will be made of overall configuration and operation of a laser processing machine including the semiconductor laser oscillator according to the embodiment.

Figure 1:
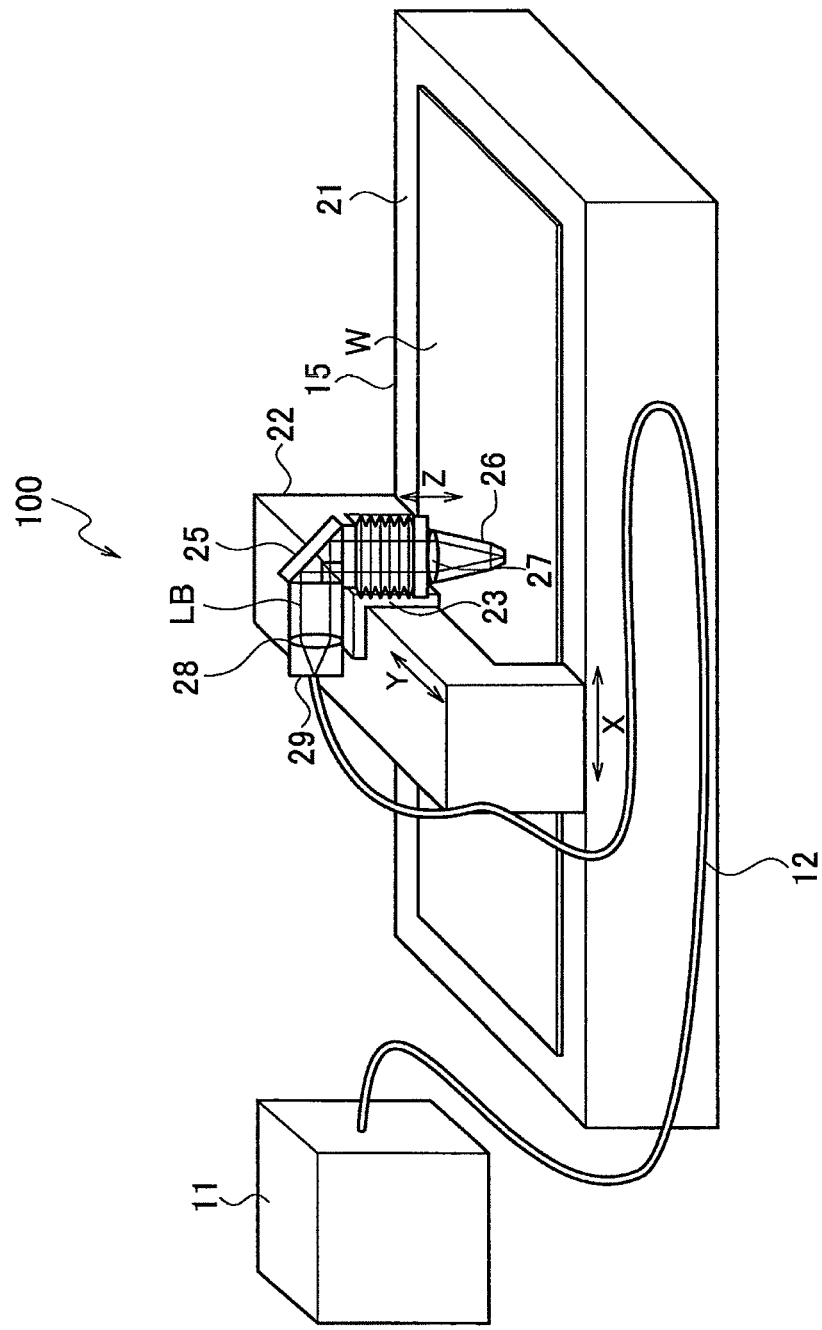
FIG. 1 is a perspective view showing an overall configuration example of a laser processing machine including a semiconductor laser oscillator according to the embodiment.

An example is given in which a laser processing machine 100 shown in FIG. 1 is a laser cutting machine that cuts a workpiece by a laser. The laser processing machine may be a laser welding machine that welds a workpiece by a laser, a surface reforming device that reforms the surface of a workpiece by a laser, and a marking device that marks a workpiece by a laser.

The laser processing machine 100 includes: a laser oscillator 11 that generates and emits a laser LB; a laser processing unit 15; and a process fiber 12 that transmits the laser LB to the laser processing unit 15.

As an example, the laser oscillator 11 is a DDL oscillator. Hereinafter, the laser oscillator 11 is referred to as a DDL oscillator 11. Specific configuration and operations of the DDL oscillator 11 will be described later in detail. The laser oscillator 11 needs only to be a wavelength-locking mechanism, and is not limited to the DDL oscillator.

The process fiber 12 is mounted along X-axis and Y-axis cable ducts (not shown) disposed in the laser processing unit 15.

The laser processing unit 15 includes: a processing table 21 on which the workpiece W is placed, a gate type X-axis carriage 22 movable on the processing table 21 in an X-axis direction; and a Y-axis carriage 23 movable on the X-axis carriage 22 in a Y-axis direction perpendicular to an X-axis. Moreover, the laser processing unit 15 includes a collimator unit 29 fixed to the Y-axis carriage 23.

The collimator unit 29 includes: a collimating lens 28 that converts a laser LB, which is emitted from an output end of the process fiber 12, into a substantially parallel luminous flux; and a bending mirror 25 that reflects the laser LB, which is converted into the substantially parallel luminous flux, downward in a Z-axis direction perpendicular to the X-axis and the Y-axis. Moreover, the collimator unit 29 includes: a focusing lens 27 that focuses the laser LB reflected by the bending mirror 25; and a processing head 26.

The collimating lens 28, the bending mirror 25, the focusing lens 27, and the processing head 26 are fixed into the collimator unit 29 in a state in which optical axes thereof are adjusted in advance. In order to correct the focal position, the collimating lens 28 may be configured to move in the X-axis direction.

The collimator unit 29 is fixed to the Y-axis carriage 23 movable in the Y-axis direction, and the Y-axis carriage 23 is provided on the X-axis carriage 22 movable in the X-axis direction. Hence, the laser processing unit 15 can move the position, at which the laser LB emitted from the processing head 26 is irradiated onto the workpiece W in the X-axis direction and the Y-axis direction.

In accordance with the above-described configuration, the laser processing machine 100 can transmit the laser LB, which is emitted from the DDL oscillator 11, to the laser processing unit 15 through the process fiber 12, can irradiate the workpiece W with the laser LB in a high energy density, and can cut the workpiece W.

Note that when the workpiece W is cut, assist gas for removing molten material is sprayed onto the workpiece W. In FIG. 1, an illustration of the configuration for spraying the assist gas is omitted.

Figure 2:
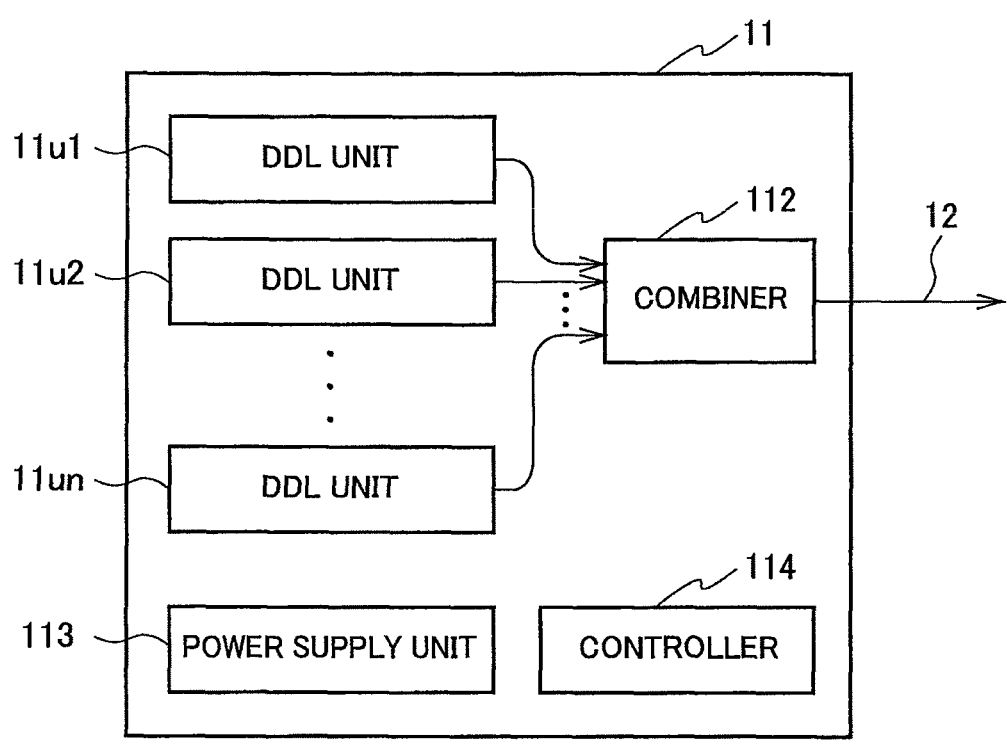
FIG. 2 is a block diagram showing a semiconductor laser oscillator according to the embodiment.

Next, a specific configuration of the DDL oscillator 11 will be described by using FIG. 2. As shown in FIG. 2, the DDL oscillator 11 includes: DDL units $11u1$ to $11un$, of which number is n; and a combiner 112 that performs spatial beam combination for lasers emitted individually from the DDL units $11u1$ to $11un$.

Moreover, the DDL oscillator 11 includes: a power supply unit 113 that supplies power to the DDL units $11u1$ to $11un$; and a controller 114 that controls the DDL oscillator 11.

A DDL unit, which is not specified to be any one of the DDL units $11u1$ to $11un$, will be referred to as a DDL unit $11u$. The number n of the DDL units $11u$ is one or more, and needs only to be appropriately set in response to an output required by the laser LB to be emitted. Note that when the number of the DDL units $11u$ is only one, the combiner is not required.

Figure 3:
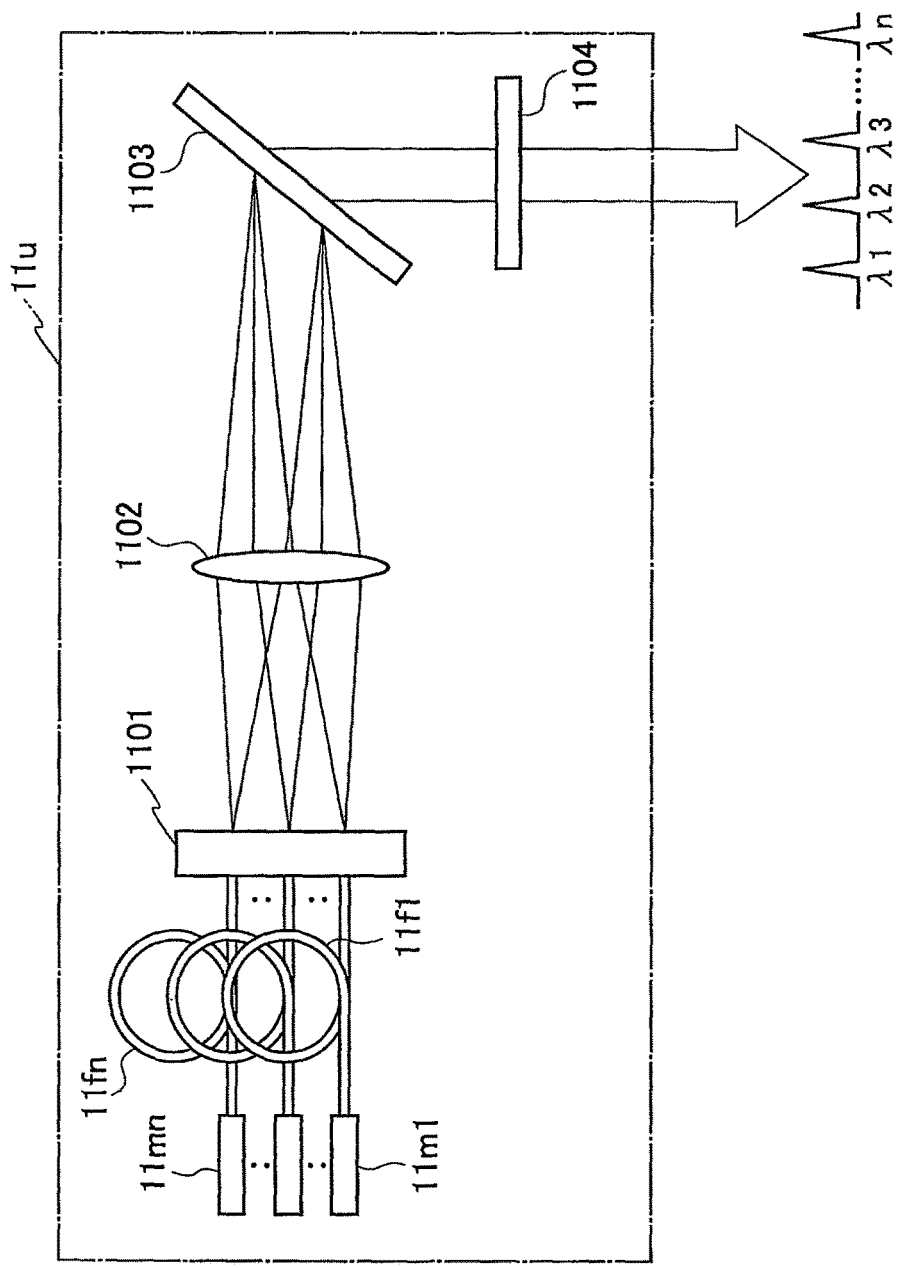
FIG. 3 is a specific configuration diagram of a DDL unit in FIG. 2.

Basic configuration and operations of the DDL unit $11u$ will be described by using FIG. 3. The DDL unit $11u$ includes laser diode modules $11m1$ to $11mn$, of which number is n.

A laser diode module, which is not specified to be any one of the laser diode modules $11m1$ to $11mn$, will be referred to as a laser diode module $11m$. The number n of such laser diode modules $11m$ also needs only to be set appropriately.

Each of the laser diode modules $11m$ is configured by connecting a plurality of laser diodes in series to one another. The number of the laser diodes is 14, for example. Wavelengths of the lasers to be locked differ among the individual laser diode modules $11m$.

In the laser diode modules $11m1$ to $11m1n$ to the respective laser diodes thereof are spatially combined with one-side ends of optical fibers $11f1$ to $11fn$. High reflection mirrors are formed on end surfaces of the respective laser diodes which compose the laser diode modules $11m1$ to $11mn$, the end surfaces being on the side opposite to the side from which the lasers are emitted. The other-side end portion of the optical fibers $11f1$ to $11fn$ compose a fiber unit 1101.

The lasers emitted from the laser diode modules $11m1$ to $11mn$ are emitted from the fiber unit 1101 are collimated by a collimating lens 1102, and become substantially parallel luminous fluxes. The respective lasers emitted from the collimating lens 1102 are deflected by a grating 1103, and are emitted via a partial reflection mirror 1104.

At this time, incident angles of the lasers onto the grating 1103 are determined depending on differences in positions of where the lasers enter the collimating lens 1102.

The lasers are partially reflected by the partial reflection mirror 1104, return to the respective laser diodes of the laser diode modules $11m$, are reflected by the high reflection mirror, and enter the partial reflection mirror 1104 again.

As described above, the lasers resonate between the high reflection mirrors of the respective laser diodes which compose the laser diode modules $11m$, and the partial reflection mirror 1104. The DDL unit $11u$ composes an external resonator. The high reflection mirrors and the partial reflection mirror 1104 compose an external resonator mirror. The DDL unit $11u$ performs wavelength-locking for the lasers by the external resonator and the grating 1103. The grating 1103 has a function to perform spectrum beam coupling in addition to the function of the wavelength-locking.

By the above-described configuration and operations, the DDL unit $11u$ outputs lasers having wavelength spectra as shown in the drawing, the wavelength spectra being locked to a plurality of wavelengths composed of the wavelengths $\lambda 1$ to $\lambda n$.

Next, a description will be made of a configuration example of the DDL unit $11u$ for maintaining the highly efficient wavelength-locking efficiency even in a state in which the temperature of the laser diode is low.

First Configuration Example

Figure 4:
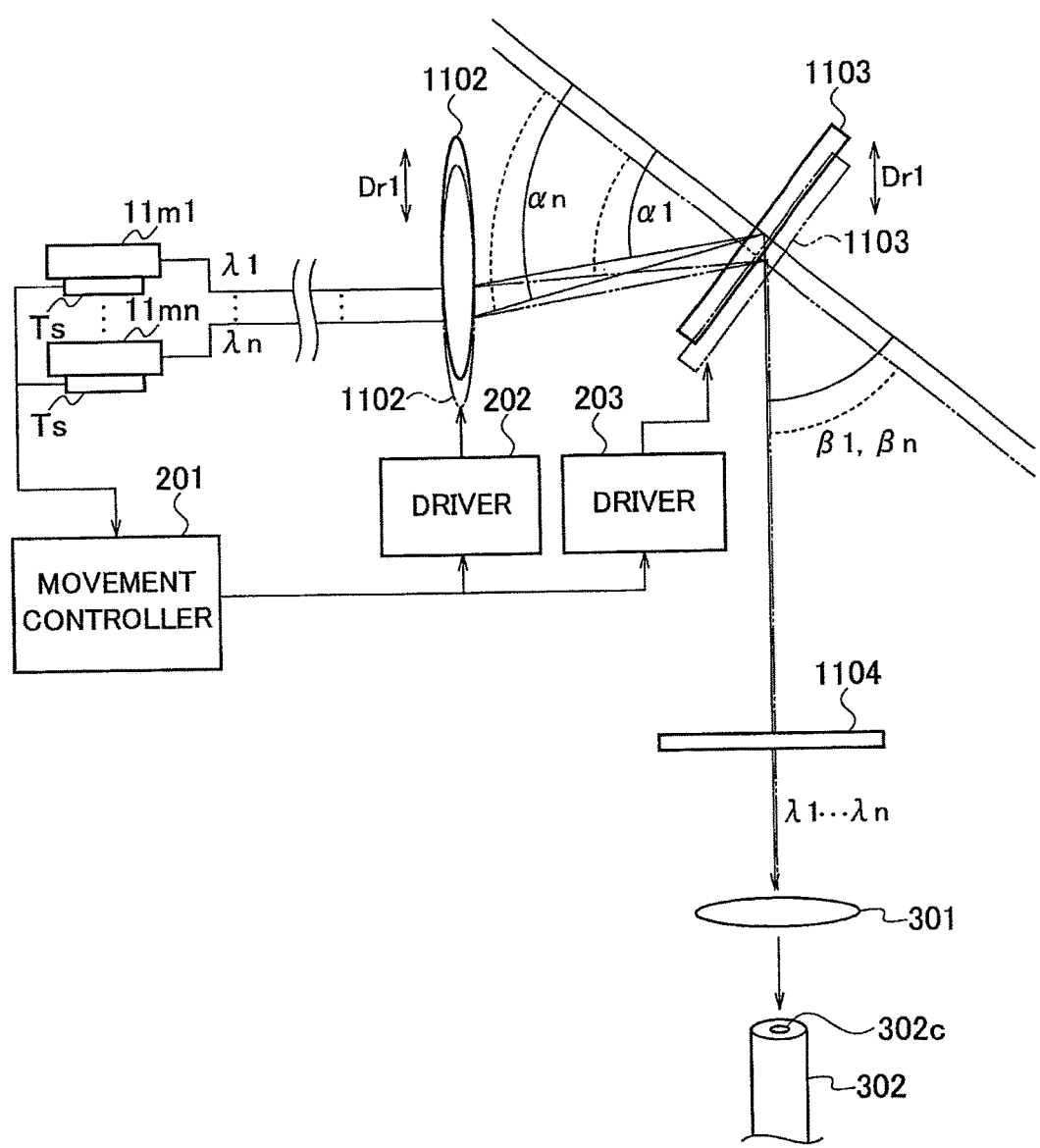
FIG. 4 is a diagram showing the first configuration example of an incident angle varying mechanism included in the semiconductor laser oscillator according to the embodiment.

FIG. 4 shows the first configuration example. In FIG. 4, the same reference numerals are assigned to the same portions as those in FIG. 3. In FIG. 4, illustration of the optical fibers 11*f*1 to 11*fn* and the fiber unit 1101 in FIG. 3 is omitted.

As shown in FIG. 4, temperature sensors TS are individually attached to the laser diode modules 11*m*1 to 11*mn*. The temperature sensors TS may be incorporated on the insides of the laser diode modules 11*m*1 to 11*mn*. The temperature sensors TS may be attached to only one of the laser diode modules 11*m*1 to 11*mn* or a plurality of selected laser diode modules 11*m*.

A laser diode module 11*m* that does not compose the external resonator may be provided separately, and a wavelength of a laser emitted from such a separate laser diode module 11*m* may be monitored, whereby the temperatures of the laser diode modules 11*m*1 to 11*mn* may be indirectly detected (measured). Such measurement (estimation) of the temperature of the laser diode module 11*m* is also included in the temperature detection by the temperature sensor.

The semiconductor laser oscillator may include a temperature sensor that directly or indirectly detects the temperature of at least one laser diode module 11*m* among the plurality of laser diode modules 11*m* by an arbitrary method.

Temperature data of the laser diode module 11*m*, which is detected by the temperature sensor TS, is supplied to a movement controller 201. The movement controller 201 can be composed of a microcomputer, for example.

The collimating lens 1102 and the grating 1103 are configured to be freely-movable along the direction Dr1 perpendicular to the optical axis of the collimating lens 1102. A driver 202 drives the collimating lens 1102 to move along the direction Dr1. A driver 203 drives the grating 1103 to move along the direction Dr1. The collimating lens 1102 and the grating 1103 may be configured to be driven by a single driver.

The movement controller 201 controls the drivers 202 and 203 in response to the temperature data inputted thereto, and places the collimating lens 1102 and the grating 1103 at predetermined positions along the common direction Dr1.

Positions of the collimating lens 1102 and the grating 1103, which are indicated by solid lines, are positions where the collimating lens 1102 and the grating 1103 should be placed when the temperature of the laser diode module 11*m* becomes equal to or higher than a predetermined temperature. Positions of the collimating lens 1102 and the grating 1103, which are indicated by chain double-dashed lines, are positions where the collimating lens 1102 and the grating 1103 should be placed when the temperature of the laser diode module 11*m* becomes lower than the predetermined temperature, such as at the time of cold start, for example.

The movement controller 201 controls the drivers 202 and 203 to place the collimating lens 1102 and the grating 1103 at the positions, which are indicated by the chain double-dashed lines at a time of cold star, and to place the collimating lens 1102 and the grating 1103 at the positions, which are indicated by the solid lines, when the temperature of the laser diode module 11*m* becomes equal to or higher than the predetermined temperature.

The movement controller 201 may control the drivers 202 and 203 to place the collimating lens 1102 and the grating 1103 alternately at the positions indicated by the chain double-dashed lines and the positions indicated by the solid lines. It is preferable that the movement controller 201 control the drivers 202 and 203 to place the collimating lens 1102 and the grating 1103 continuously from the positions indicated by the chain double-dashed lines to the positions indicated by the solid lines in response to a temperature rise of the laser diode module 11*m*.

The movement controller 201 may control the drivers 202 and 203 to change the positions of the collimating lens 1102 and the grating 1103 discretely between the positions indicated by the chain double-dashed lines and the positions indicated by the solid lines in response to a plurality of the temperatures of the laser diode module 11*m*.

In FIG. 4, the movement controller 201 and the drivers 202 and 203 compose an incident angle varying mechanism that changes the incident angles of the respective lasers, at which the lasers emitted from the collimating lens 1102 are incident onto the grating 1103, in response to the temperatures detected by the temperature sensors TS.

Here, the relationship between the incident angle $\alpha$ and the emission angle $\beta$ in the grating 1103 is expressed by the following Equation (1):

$$d \cdot \sin \alpha + d \cdot \sin \beta = n\lambda$$

where d is a slit period of the grating 1103, $\lambda$ is a wavelength, and n is an order.

When the temperature changes and the wavelength shifts to $(\lambda+\delta\lambda)$, then in order to make the lasers incident onto a predetermined position (for example, the center) of the partial reflection mirror 1104, it is necessary to adjust the incident angle $\alpha$ as shown in the following Equation (2):

$$d \cdot \sin(\alpha+\delta\alpha) + d \cdot \sin \beta = n(\lambda+\delta\lambda)$$

The value of $\delta\alpha$ is determined from Equations (1) and (2). Since $\delta\lambda$ is much smaller than $\lambda$, $\delta\alpha$ is also much smaller than $\alpha$, and linear approximation is sufficient for $\delta\alpha/\alpha$. Hence, it is understood that $\delta\alpha$ only needs to be obtained by the following Equation (3):

$$\delta\alpha = n\delta\lambda/d \cdot \cos \alpha$$

Specific functions by the first configuration example are as follows. As an example, values are set such that n=1, f=80 for the collimating lens 1102, and the number of slits of the grating 1103 is 1600 lines/mm.

The DDL unit 11*u* is optimally adjusted so that the collimated laser can be made incident onto the grating 1103 at an angle from 48.5 degrees ($\alpha$1) to 54.3 degrees ($\alpha$n), and the laser can be emitted at 51.3 degrees ($\beta$1 to $\beta$n). The locking wavelengths $\lambda$1 to $\lambda$n are 956 nm to 996 nm.

In the state in which the temperature is low, the wavelengths of the laser shift to a lower wavelength side of 0.3 nm/° C., lowering the wavelength-locking efficiency, and lowering the output. At the time of cold start when the temperature is 20 degrees lower than in the state in which the DDL unit 11*u* is adjusted optimally as described above, a wavelength optimal for the wavelength-locking is on a wavelength side 6 nm lower than 0.3 nm/° C.×20° C.

Accordingly, the collimating lens 1102 and the grating 1103 are moved in one direction (the downward direction in FIG. 4) by the drivers 202 and 203, so that the incident angles of the lasers can decrease by 0.8 degrees. Then, the incident angles of the lasers become 47.7 degrees ($\alpha$1) to 53.5 degrees ($\alpha$n), and the locking wavelengths $\lambda$1 to $\lambda$n become 950 nm to 990 nm. The emission angle of the laser does not change from 51.3 degrees ($\beta$1 to $\beta$n).

In FIG. 4, the laser emitted from the partial reflection mirror 1104 is focused onto a fiber core 302c of an optical fiber 302 by a focus lens 301, and is incident onto the fiber core 302c.

Hence, the optical axis of the laser can be prevented or reduced from deviating from the original optical axis at the time of low temperature, and a loss of the laser can be reduced. In this way, the possibility to damage the optical fiber 302 can be reduced, and heat generation can be suppressed. In accordance with the first configuration example, it becomes possible to maximize the performance of the semiconductor laser oscillator.

Second Configuration Example

Figure 5:
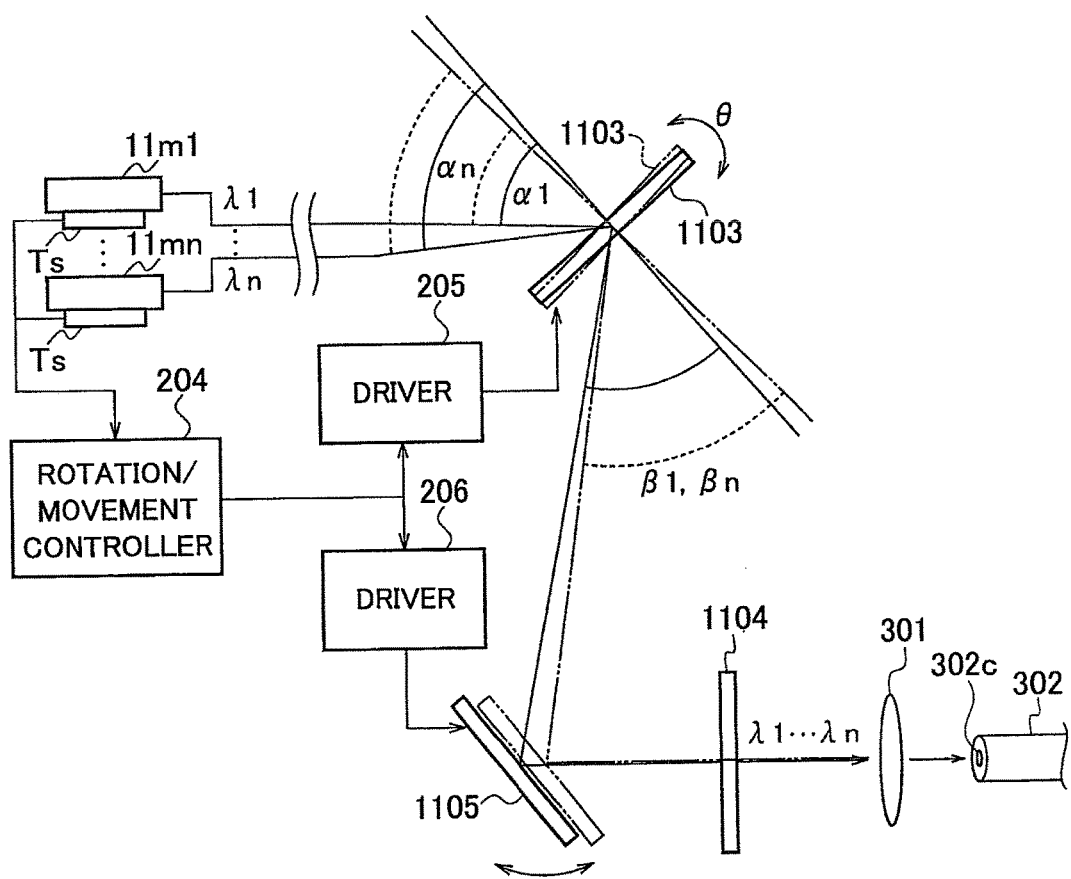
FIG. 5 is a diagram showing the second configuration example of the incident angle varying mechanism included in the semiconductor laser oscillator according to the embodiment.

FIG. 5 shows the second configuration example. In FIG. 5, the same reference numerals are assigned to the same portions as those in FIG. 3 and FIG. 4. In FIG. 5, an illustration of the optical fibers 11f1 to 11fn, the fiber unit 1101 and the collimating lens 1102 in FIG. 3 are omitted.

The configuration and operation of the second configuration example will be described focusing on the differences from the first configuration example. In the second configuration example, the collimating lens 1102 is fixed.

Temperature data of the laser diode module 11m, which is detected by the temperature sensor TS, is supplied to a rotation/movement controller 204. For example, the rotation/movement controller 204 can be composed of a microcomputer.

The grating 1103 is configured to be freely-rotatable. When the grating 1103 is rotated, the optical axis, along which the laser is emitted, is deviated. In the second configuration example, a total reflection mirror 1105, which is freely-movable, is disposed between the grating 1103 and the partial reflection mirror 1104 in order to correct the deviation of the optical axis.

A driver 205 drives the grating 1103 to rotate. A driver 206 drives the total reflection mirror 1105 to move. In response to the inputted temperature data, the rotation/movement controller 204 controls the drivers 205 and 206 to rotate the grating 1103, and to move the total reflection mirror 1105.

Positions of the grating 1103 and the total reflection mirror 1105, which are indicated by solid lines, are positions where the grating 1103 and the total reflection mirror 1105 should be placed when the temperature of the laser diode module 11m becomes equal to or higher than the predetermined temperature. Positions of the grating 1103 and the total reflection mirror 1105, which are indicated by chain double-dashed lines, are positions where the grating 1103 and the total reflection mirror 1105 should be placed when the temperature of the laser diode module 11m becomes lower than the predetermined temperature, such as at a time of cold start, for example.

The rotation/movement controller 204 controls the drivers 205 and 206 to place the grating 1103 and the total reflection mirror 1105 at the positions, which are indicated by the chain double-dashed lines at the time of cold star, and to place the grating 1103 and the total reflection mirror 1105 at the positions, which are indicated by the solid lines, when the temperature of the laser diode module 11m becomes equal to or higher than the predetermined temperature.

The rotation/movement controller 204 may control the drivers 205 and 206 to place the grating 1103 and the total reflection mirror 1105 alternately at the positions indicated by the chain double-dashed lines and the positions indicated by the solid lines. It is preferable that the rotation/movement controller 204 control the drivers 205 and 206 to place the grating 1103 and the total reflection mirror 1105 continuously from the positions indicated by the chain double-dashed lines to the positions indicated by the solid lines in response to a temperature rise of the laser diode module 11m.

In FIG. 5, the rotation/movement controller 204 and the drivers 205 and 206 compose an incident angle varying mechanism that changes the incident angles of the respective lasers, at which the lasers emitted from the collimating lens 1102 are incident onto the grating 1103 in response to the temperatures detected by the temperature sensors TS.

Also in the second configuration example, it is assumed that in the state in which the DDL unit 11u is adjusted optimally, the incident angles of the lasers are 48.5 degrees ($\alpha 1$) to 54.3 degrees ($\alpha n$), the emission angle of the lasers is 51.3 degrees ($\beta 1$ to $\beta n$), and the locking wavelengths $\lambda 1$ to $\lambda n$ are 956 nm to 996 nm.

At the time of cold start when the temperature is 20 degrees lower, the grating 1103 is rotated by 0.8 degrees as a rotation angle $\theta$, and the total reflection mirror 1105 is moved so as to correct the deviation of the optical axis, which follows such an action that the grating 1103 is rotated by 0.8 degrees.

The incident angles of the lasers can be set at 47.7 degrees ($\alpha 1$) to 53.5 degrees ($\alpha n$), the emission angle of the lasers can be fixed at 51.3 degrees ($\beta 1$ to $\beta n$), and the locking wavelengths $\lambda 1$ to $\lambda n$ can be set at 950 nm to 990 nm.

Also in the second configuration example, the optical axis of the laser can be prevented or reduced from deviating from the original optical axis at the time low temperature, and the loss of the laser can be reduced. In accordance with the second configuration example, the possibility to damage the optical fiber 302 can be reduced, heat generation can be suppressed, and it becomes possible to maximize the performance of the semiconductor laser oscillator.

Third Configuration Example

Figure 6:
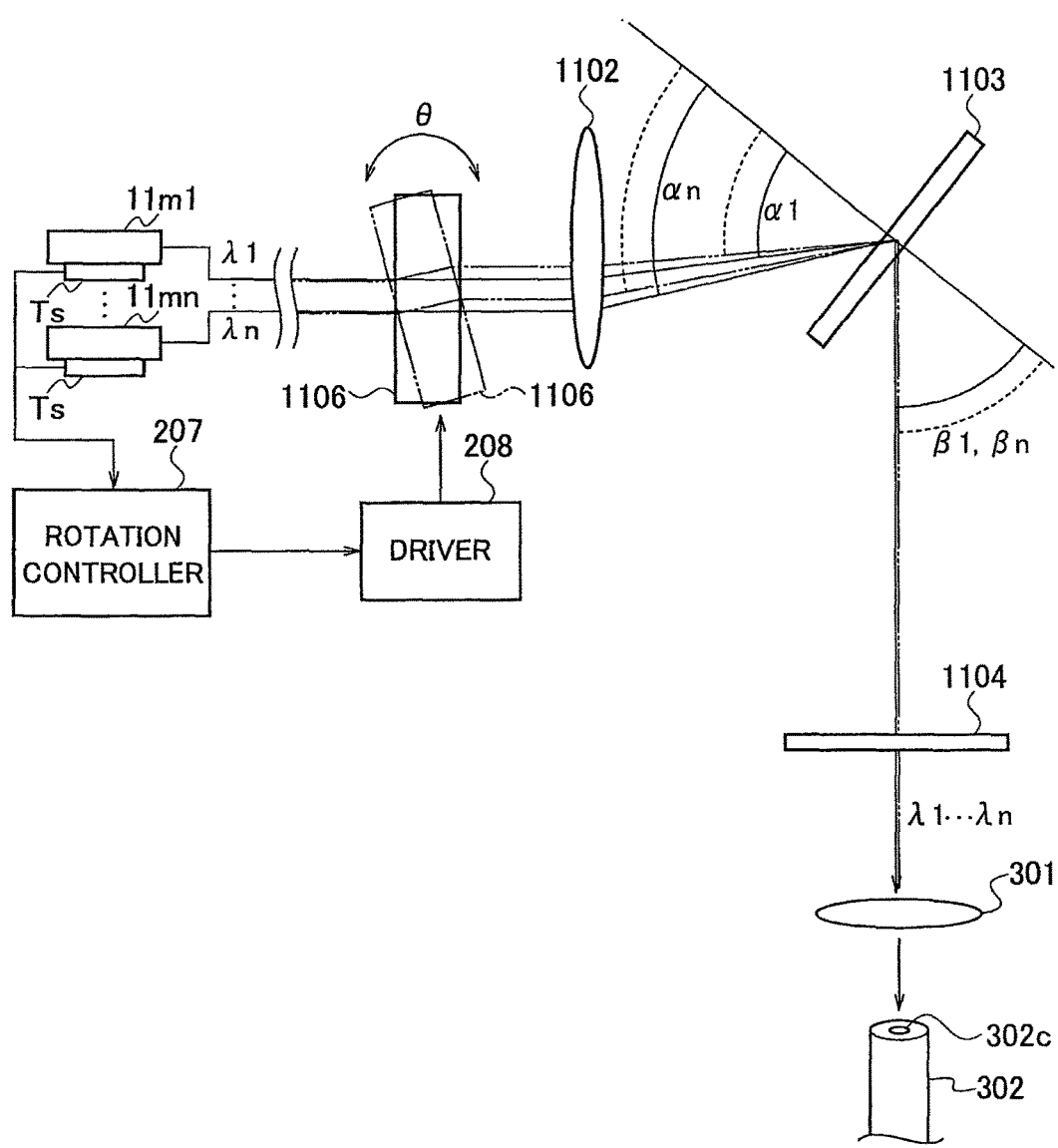
FIG. 6 is a diagram showing the third configuration example of the incident angle varying mechanism included in the semiconductor laser oscillator according to the embodiment.

FIG. 6 shows the third configuration example. In FIG. 6, the same reference numerals are assigned to the same portions as those in FIG. 3 and FIG. 4. Also in FIG. 6, the illustration of the optical fibers 11f1 to 11fn and the fiber unit 1101 in FIG. 3 is omitted.

The configuration and operation of the third configuration example will be described focusing on differences from the first configuration example. In the third configuration example, the collimating lens 1102 and the grating 1103 are fixed. In the third configuration example, a synthetic quartz substrate 1106 is disposed in front of the collimating lens 1102, that is, between the fiber unit 1101 (not shown) and the collimating lens 1102. The synthetic quartz substrate 1106 is artificially manufactured quartz glass.

Temperature data of the laser diode module 11m, which is detected by the temperature sensor TS, is supplied to a rotation controller 207. The rotation controller 207 can be composed of a microcomputer, for example.

The synthetic quartz substrate 1106 is configured to be freely-rotatable. The thickness of the synthetic quartz substrate 1106 is 15 mm, for example. When the synthetic quartz substrate 1106 is rotated, the optical axis, along which the laser is emitted, is deviated due to refraction of the synthetic quartz substrate 1106.

A driver 208 drives the synthetic quartz substrate 1106 to rotate. The rotation controller 207 controls the driver 208 in response to the temperature data inputted thereto, and rotates the synthetic quartz substrate 1106.

The position of the synthetic quartz substrate 1106, which is indicated by a solid line, is a position where the synthetic quartz substrate 1106 should be placed when the temperature of the laser diode module 11*m* becomes equal to or higher than the predetermined temperature. The position of the synthetic quartz substrate 1106, which is indicated by a chain double-dashed line, is a position where the synthetic quartz substrate 1106 should be placed when the temperature of the laser diode module 11*m* becomes lower than the predetermined temperature, such as at a time of cold start, for example.

The rotation controller 207 controls the driver 208 to place the synthetic quartz substrate 1106 at the position, which is indicated by the chain double-dashed line at the time of cold start, and to place the synthetic quartz substrate 1106 at the position, which is indicated by the solid line, when the temperature of the laser diode module 11*m* becomes equal to or higher than the predetermined temperature.

The rotation controller 207 may control the driver 208 to place the synthetic quartz substrate 1106 alternately at the position indicated by the chain double-dashed line and the position indicated by the solid line. It is preferable that the rotation controller 207 control the driver 208 to place the synthetic quartz substrate 1106 continuously from the position indicated by the chain double-dashed line to the position indicated by the solid line in response to a temperature rise of the laser diode module 11*m*.

In FIG. 6, the rotation controller 207 and the driver 208 compose an incident angle varying mechanism that changes the incident angles of the respective lasers, at which the lasers emitted from the collimating lens 1102 are incident onto the grating 1103, in response to the temperatures detected by the temperature sensors TS.

Also in the third configuration example, it is assumed that, in the state in which the DDL unit 11*u* is adjusted optimally, the incident angles of the lasers are 48.5 degrees ($\alpha 1$) to 54.3 degrees ($\alpha n$), the emission angle of the lasers is 51.3 degrees ($\beta 1$ to $\beta n$), and the locking wavelengths $\lambda 1$ to $\lambda n$ are 956 nm to 996 nm.

At the time of cold start when the temperature is 20 degrees lower, the synthetic quartz substrate 1106 is rotated by 14 degrees as the rotation angle $\theta$. Then, the refraction of the synthetic quartz substrate 1106 deviates from the optical axis by 1.15 mm, and the incident angles onto the grating 1103 decrease by 0.8 degrees. In this way, the locking wavelength is shifted to the low wavelength side by 6 nm.

Also in the third configuration example, the incident angles of the lasers can be set at 47.7 degrees ($\alpha 1$) to 53.5 degrees ($\alpha n$), the emission angle of the lasers can be fixed at 51.3 degrees ($\beta 1$ to $\beta n$), and the locking wavelengths $\lambda 1$ to $\lambda n$ can be set at 950 nm to 990 nm.

Also in the third configuration example, the optical axis of the laser can be prevented or reduced from deviating from the original optical axis at a time of low temperature, and the loss of the laser can be reduced. In accordance with the third configuration example, the possibility to damage the optical fiber 302 can be reduced, heat generation can be suppressed, and it becomes possible to maximize the performance of the semiconductor laser oscillator.

As described above, in accordance with the semiconductor laser oscillator according to the embodiment, the wavelength-locking efficiency at the time when the output of the oscillator is low can be improved. Hence, in accordance with the semiconductor laser oscillator according to the embodiment, the highly efficient wavelength-locking efficiency can be maintained even in a state in which the temperature of the laser diode is low.

The present invention is not limited to the embodiment described above, and is changeable in various ways within the scope without departing from the scope of the present invention.

INDUSTRIAL APPLICABILITY

The present invention can be used for a semiconductor laser oscillator that emits a laser.

The invention claimed is:

1. A semiconductor laser oscillator comprising:
   a plurality of laser diode modules;
   a temperature sensor configured to directly or indirectly detect a temperature of at least one laser diode module among the plurality laser diode modules;
   a collimating lens configured to collimate respective laser beams emitted from the laser diode modules;
   a grating configured to perform spectrum beam coupling for the laser beams emitted from the collimating lens; and
   an incident angle varying mechanism configured to change incident angles of the respective laser beams incident on the grating, in response to the temperature detected by the temperature sensor;
   wherein the incident angle varying mechanism comprises:
      a driver configured to move the collimating lens and the grating in a common direction and in a direction perpendicular to an optical axis of the collimating lens; and
      a movement controller configured to control movement of the collimating lens and the grating in response to the temperature detected by the temperature sensor.

2. A semiconductor laser oscillator comprising:
   a plurality of laser diode modules;
   a temperature sensor configured to directly or indirectly detect a temperature of at least one laser diode module among the plurality laser diode modules;
   a collimating lens configured to collimate respective laser beams emitted from the laser diode modules;
   a grating configured to perform spectrum beam coupling for the laser beams emitted from the collimating lens; and
   an incident angle varying mechanism configured to change incident angles of the respective laser beams incident on the grating, in response to the temperature detected by the temperature sensor;
   wherein the incident angle varying mechanism comprises:
      a first driver configured to rotate the grating in a direction of changing incident angles of the laser beams;
      a total reflection mirror onto which the laser beams emitted from the grating is incident;
      a second driver configured to move the total reflection mirror in a direction parallel to an optical axis of the laser beams emitted from the total reflection mirror, so that a deviation of an optical axis of the laser emitted from the grating is corrected, the deviation being caused by an action that the first driver rotates the grating; and
      a rotation/movement controller configured to control the rotation of the grating by the first driver and the movement of the total reflection mirror by the second driver in response to the temperature detected by the temperature sensor.

3. A semiconductor laser oscillator comprising:
a plurality of laser diode modules;
a temperature sensor configured to directly or indirectly detect a temperature of at least one laser diode module among the plurality laser diode modules;
a collimating lens configured to collimate respective laser beams emitted from the laser diode modules;
a grating configured to perform spectrum beam coupling for the laser beams emitted from the collimating lens; and
an incident angle varying mechanism configured to change incident angles of the respective laser beams incident on the grating, in response to the temperature detected by the temperature sensor;
wherein the incident angle varying mechanism comprises:
 a synthetic quartz substrate disposed in front of the collimating lens;
 a driver configured to rotate the synthetic quartz substrate to change incident angles of the laser beams incident onto the grating; and
 a rotation controller configured to control rotation of the synthetic quartz substrate by the driver in response to the temperature detected by the temperature sensor, in such a way that a surface of the synthetic quartz substrate is less than 90 degrees with respect to an optical axis of the laser beams incident on the synthetic quartz substrate, when the temperature of the laser diode module is lower than a predetermined temperature, and that the surface of the synthetic quartz substrate is 90 degrees with respect to the optical axis of the laser beams incident on the synthetic quarts substrate, when the temperature of the laser diode module is equal to or higher than the predetermined temperature.

4. The semiconductor laser oscillator according to claim 1, wherein the movement controller controls the driver to place the collimating lens and the grating alternately at two positions in response to the temperature detected by the temperature sensor.

5. The semiconductor laser oscillator according to claim 1, wherein the movement controller controls the driver to place the collimating lens and the grating continuously from a first position to a second position in response to the temperature detected by the temperature sensor.

6. The semiconductor laser oscillator according to claim 1, wherein the movement controller controls the driver to place the collimating lens and the grating discretely between two positions in response to the temperature detected by the temperature sensor.

7. The semiconductor laser oscillator according to claim 2, wherein the rotation/movement controller controls the first driver to rotate the grating alternately at two angles in response to the temperature detected by the temperature sensor and controls the second driver to place the total reflection mirror alternately at two positions in response to the temperature detected by the temperature sensor.

8. The semiconductor laser oscillator according to claim 2, wherein the rotation/movement controller controls the first driver to rotate the grating continuously from a first angle to a second angle in response to the temperature detected by the temperature sensor, and controls the second driver to place the total reflection mirror continuously from a first position to a second position in response to the temperature detected by the temperature sensor.

9. The semiconductor laser oscillator according to claim 3, wherein the rotation controller controls the driver to rotate the synthetic quartz substrate alternately at two angles in response to the temperature detected by the temperature sensor.

10. The semiconductor laser oscillator according to claim 3, wherein the rotation controller controls the driver to rotate the synthetic quartz substrate continuously from a first angle to a second angle in response to the temperature detected by the temperature sensor.

* * * * *

UNITED STATES PATENT AND TRADEMARK OFFICE
CERTIFICATE OF CORRECTION

PATENT NO. : 10,283,934 B2
APPLICATION NO. : 15/540062
DATED : May 7, 2019
INVENTOR(S) : Kaori Usuda It is certified that error appears in the above-identified patent and that said Letters Patent is hereby corrected as shown below:

In the Claims

Column 10, Line 18 (Claim 1, Line 5) please change "plurality laser" to -- plurality of laser --
Column 10, Line 40 (Claim 2, Line 5) please change "plurality laser" to -- plurality of laser --
Column 11, Line 5 (Claim 3, Line 5) please change "plurality laser" to -- plurality of laser --

Signed and Sealed this
Twelfth Day of November, 2019

Andrei Iancu
*Director of the United States Patent and Trademark Office*